United States Patent [19]

Tannery, IV

[11] Patent Number: 4,590,61:

[45] Date of Patent: May 20, 198(

[54] BIPOLAR AGC WITH RF TRANSISTOR DC BIAS POINT STABILIZATION

[75] Inventor: George F. Tannery, IV, Greenfield, Ind.

[73] Assignee: RCA Corporation, Princeton, N.J.

[21] Appl. No.: 564,911

[22] Filed: Dec. 23, 1983

[51] Int. Cl.$^4$ .......................... H04B 1/26; H03G 3/30
[52] U.S. Cl. .................................... 455/200; 455/253; 455/315; 455/341; 330/279; 330/285
[58] Field of Search ............... 455/188, 200, 241, 251, 455/253, 247, 315, 341; 330/278, 279, 285

[56] References Cited

U.S. PATENT DOCUMENTS

| | | | |
|---|---|---|---|
| 2,834,877 | 5/1958 | Milwitt | 455/251 |
| 3,395,357 | 7/1968 | Ketchledge | 330/285 |
| 3,411,099 | 11/1968 | Barditch et al. | 330/285 |
| 3,430,155 | 2/1969 | Harwood | 455/253 |
| 3,482,167 | 12/1969 | Kaplan et al. | |
| 3,493,882 | 2/1970 | Seader et al. | |
| 3,510,580 | 5/1970 | Okuno | 330/285 |
| 3,551,834 | 12/1970 | Yamazaki et al. | 330/285 |
| 3,805,164 | 4/1974 | Callaway | 455/341 |
| 3,903,480 | 9/1975 | Shibahara et al. | 455/25 |
| 4,162,452 | 7/1979 | Ash | 455/31 |
| 4,172,239 | 10/1979 | Harford | |
| 4,277,757 | 7/1981 | Kennedy | 330/28 |
| 4,397,037 | 8/1983 | Theriault | |
| 4,408,348 | 10/1983 | Theriault | |

FOREIGN PATENT DOCUMENTS 2114391A 1/1982 United Kingdom .

*Primary Examiner*—Jin F. Ng
*Attorney, Agent, or Firm*—Paul J. Rasmussen; Peter M Emanuel; Adel A. Ahmed

[57] ABSTRACT

A common emitter transistor amplifier has a contro transistor coupled between its collector and base. Th( base of the control transistor receives an AGC voltag( so that the control transistor varies the base current anc hence the gain of the common emitter transistor. Th( common emitter transistor is used as an RF amplifier ir a double conversion television tuner having a doubl) balanced first mixer. Varying the gain of the RF stag( protects the mixer from overload.

11 Claims, 2 Drawing Figures

BIPOLAR AGC WITH RF TRANSISTOR DC BIAS POINT STABILIZATION

The present invention relates to a circuit for applying AGC (automatic gain control) to an RF (radio frequency) amplifying stage, and more particularly to such a circuit that is suitable for use in a double conversion television tuner.

A double conversion television tuner is disclosed in U.S. patent application No. 508,595, filed June 28, 1983, in the names of G. C. Hermeling and M. W. Muterspaugh, and under common assignment herewith. This double conversion has a high first IF (intermediate frequency) e.g., 608-614 MHz, so that image rejection and other spurious response rejection are improved as compared to a single conversion tuner. This allows a greater number of UHF (ultra high frequency) channels to be allocated in a given service area. Further, in the double conversion tuner of said application, the first mixer is of the doubly balanced mixer (DBM) type so that RF and first local oscillator (LO) signals are not fed through to the first IF section. This is particularly important when the first IF signal has a frequency range of 608-612 MHz, which corresponds to unused UHF channel 37, to prevent feed through interference due to strong RF signals for adjacent channels 36 and 38. These aspects are explained in greater detail in the aforementioned patent application.

One type of DBM includes a diode bridge and baluns for coupling the RF and LO signals to the bridge. Typically, a diode bridge has a low input impedance and as a result a DBM of this type has a balanced and low value, e.g., 200 ohm input impedance. Ahead of the balun is first a lowpass filter, and ahead of the lowpass filter is another lowpass or a highpass filter depending on the frequency of the selected channel. Ahead of the filters is the RF amplifying stage. It is desired that the output impedance of the first lowpass filter has a low value to match the input impedance of the DBM for maximum power transfer and also to inhibit attenuation due to stray capacitance. Unfortunately, typical filters require the same input and output impedance for a flat response. Thus the RF stage must drive a low impedance load.

MOSFET (metal oxide semiconductor field effect transistor) amplifiers are widely used as RF amplifiers. The MOSFET is linear (output current follows input voltage) over a range of about 0-12 ma., while a bipolar type typically is linear over a 0-30 ma. range. It is herein recognized that this greater linear current range makes a bipolar transistor the preferred choice for an RF stage when such a stage must drive a low impedance (high current) device such as a balun of a DBM.

Negative RF feedback can be used to provide a low, e.g., 50 ohm, output impedance to match to the low input impedance of a following device, such as a filter, and in order to provide a flat gain versus frequency response. However, when negative feedback is used, a bipolar transistor is the preferred choice since a MOSFET does not have enough gain.

A bipolar transistor in the common collector (or the emitter follower) configuration does not provide voltage gain and is susceptible to oscillations. The common base configuration has low gain, has too low an input impedance to allow switching diodes to be used if desired for bandswitching purposes. Also, since there is no phase inversion between the input and output, negative RF feedback cannot easily be used. Thus, it is herein recognized that the common emitter configuration is preferred for driving a low input impedance device such as a balun of a DBM.

When a bipolar transistor is used in the common emitter configuration, it is conventional to use a resistor bypassed by a capacitor connected between the emitter and ground to provide negative DC feedback so that the bias point is stable with changes of the transistor beta. However, the leads of the bypass capacitor have a relatively large inductance, especially at UHF frequencies, so that the bypassing is no longer effective. This requires the use of an emitter that is directly connected to ground, or grounded through a low value resistor which results in an unstable operating point when using a conventional biasing scheme. Such an amplifier, having an auxiliary transistor coupled between the collector and base of the RF transistor for a stable and fixed biasing scheme, is shown in U.S. Pat. No. 3,493,882 However, this circuit does not have any provisions for providing automatic gain control (AGC).

It is very important for an RF amplifier stage of television tuners to include provisions for AGC. If a PIN (positive-intrinsic-negative) diode attenuator is used between the RF stage and the DBM, the RF stage may overload in the presence of strong signals and thereby produce clipping distortion. If a PIN diode attenuator is used before the RF stage, its inherent minimum loss causes an increase in the noise figure of the RF stage Thus the RF stage itself should have its gain controlled While a variable resistor (such as a PIN diode) can provide variable negative RF feedback around the RF stage, to control its gain, this can only provide a minimum gain of unity when the resistance equals zero ohms, i.e., maximum negative feedback. However, the gain control range may require that the RF stage provide attenuation to avoid overloading of the DBM Therefore, the use of variable RF feedback is unsatisfactory.

In accordance with an aspect of the invention, the invention comprises a bipolar common emitter transistor amplifier, with the type of advantageous biasing scheme of the aforementioned U.S. Pat. No. 3,493,882 but with AGC provisions is used as an RF amplifier especially well suited for a double conversion tuner using a DBM as described above. Specifically, variable means, such as the collector-emitter path of a second transistor receiving AGC voltage at its base, is DC coupled between the base and collector electrodes of said transistor for varying the base bias current of said transistor in accordance with the AGC voltage and thereby varying the gain of said amplifier.

These and other aspects of the invention will be described with reference to the accompanying drawing in which:

FIG. 1 is a partly schematic and partly block diagram of a double conversion tuner incorporating the preferred embodiment of the invention; and FIG. 2 is a simplified schematic drawing of an implementation of the first IF amplifier used in the double conversion tuner shown in FIG. 1.

DETAILED DESCRIPTION

Figure 1:
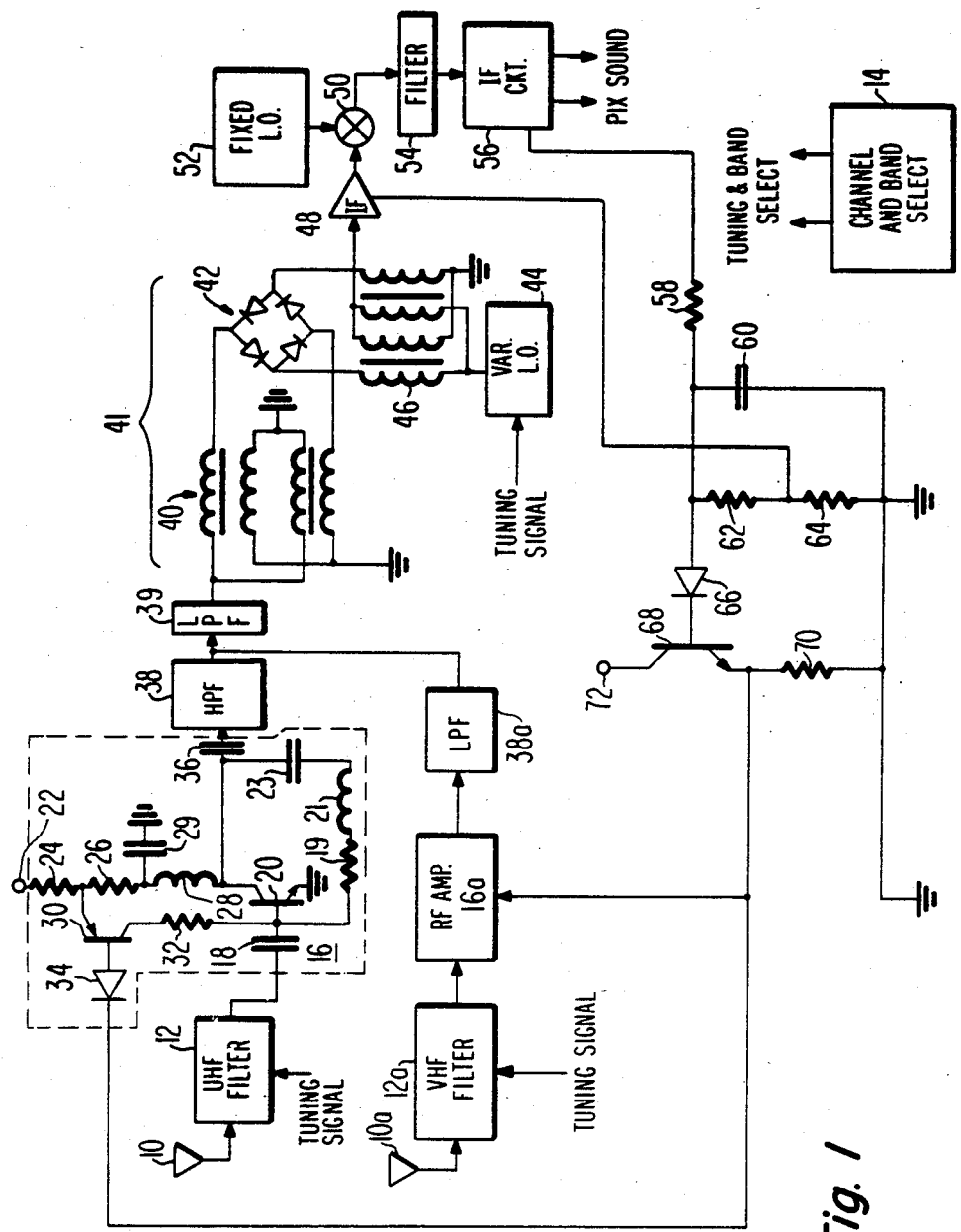

In FIG. 1, a UHF antenna 10 receives UHF television signals which are applied to tunable UHF filter 12 which filter receives tuning and bandswitching signals from channel and band select unit 14, e.g., as shown in U.S. Pat. No. 4,408,348. The signal from filter 12 is applied to RF amplifying stage 16. In particular, the UHF signal is applied through DC blocking capacitor 18 to the base of grounded emitter NPN transistor 20. When a UHF channel is selected, a bandswitching voltage, e.g., 18 volts, is coupled from channel and band select unit 14 to supply terminal 22, which is coupled to the collector of transistor 20 through series coupled resistors 24 and 26 and RF choke coil 28. A capacitor 29 bypasses to ground the junction of coil 28 and resistor 26. A PNP transistor 30 has its emitter connected to the junction of resistors 24 and 26 and its collector connected through current limiting resistor 32 to the base of transistor 20. Transistor 30 provides base current to transistor 20 in accordance with an AGC signal applied to its base through an isolation diode 34 as is explained in detail below. Negative RF feedback is provided by resistor 19, inductance 21 and DC blocking capacitor 23. The feedback is designed to provide essentially 50 ohms input and output impedance for stage 16 and essentially constant gain over the UHF television band. The amplified RF signal at the collector of transistor 20 is applied through DC blocking capacitor 36 to HPF (high pass filter) 38 having a cutoff frequency of about 440 MHz and 50 ohms input and output impedances.

In like manner to the UHF signal path, a source of VHF signals shown, e.g., as a VHF antenna 10a, applies VHF signals to tunable VHF filter 12a, which receives tuning and bandswitching signals from unit 14. The output signal from filter 12a is applied to RF amplifier 16a, which is of identical construction, except for some component values, to that of amplifier 16. Amplifier 16a also receives an AGC signal. The output signal from amplifier 16a is applied to LPF (low pass filter) 38a having a cutoff frequency of about 420 MHz and input and output impedances of 50 ohms.

The outputs of filters 38 and 38a are coupled together and to the input of LPF 39 having a cutoff frequency of about 890 MHz, which forms a bandpass filter with HPF 38 for UHF signals. The output signal from LPF 39 is applied to 1:4 impedance transforming balun 40 of a DBM (doubly balanced mixer) 41.

When a channel in the UHF band is selected, amplifier 16 is caused to be on by the application of supply voltage to terminal 22 and amplifier 16a is caused to be off by the application of ground potential to terminal 22a. The reverse is true when a VHF channel is selected. Filters 38 and 38a serve to further isolate the selected one of the UHF and VHF signal paths (as determined by unit 14) from the non-selected path, as is explained in greater detail in U.S. Pat. No. 4,397,037. In addition, diode 34 of amplifier 16 and a corresponding diode of amplifier 16a are reversed biased in response to the AGC voltage, which is positive, when the respective one of amplifiers 16 and 16a is caused to be off by the application of ground potential to the respective one of terminals 22 and 22a. The diode in the AGC signal path of the off amplifier is rendered non-conducting so as to prevent loading of the AGC line by the off amplifier.

In DBM 41, the balanced output signals of balun 40 are applied a diode bridge 42. Also applied to diode bridge 42 are the balanced output signals of a 1:4 balun 46 which receives at its unbalanced input the output signal from variable local oscillator (LO) 44. Oscillator 44 has its frequency controlled in response to a tuning voltage produced by unit 14 which may, for that purpose, include a phase locked loop. The frequency of LO 44 has a range of 668 to 1498 MHz. IF (intermediate frequency) amplifier 48 is coupled to an output of DBM 41 taken from balun 46 and is tuned to have a bandpass characteristic from 608 to 614 MHz (which corresponds to UHF channel 37) and thus selects and amplifies the difference frequency output signal from DBM 41. Amplifier 48 also receives an AGC signal.

The reason for using channel 37, which is not used for TV broadcast, for the frequency range of the first IF signal is explained in said U.S. patent application No. 508,595. Also, as explained in greater detail in said application, the use of a DBM as mixer 41 is very important since it rejects direct feedthrough signals such as the RF signals for channels 36 and 38.

Figure 2:
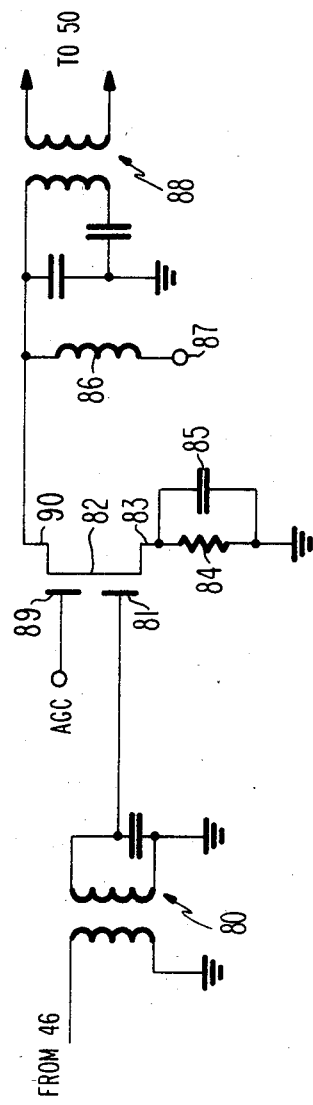

FIG. 2 shows an implementation of amplifier 48. The signal from balun 46 is applied to filter circuit 80 tuned to have a bandpass characteristic between 608 and 614 MHz. The signal is then applied to gate 81 of MOSFET 82. Source 83 is coupled to ground through biasing resistor 84 and bypass capacitor 85. The source need not be directly connected to ground since the high impedance of MOSFET 82 reduces the effect of inherent stray reactances. A second gate 89 receives the AGC voltage to control the gain of MOSFET 82. Drain 90 is supplied with operating voltage by way of RF choke 86 from supply terminal 87. Filter circuit 88 is also tuned to have a bandpass characteristic between 608 and 614 MHz and applies the signal to mixer 50 of the FIG. 1 arrangement.

As will be explained below in greater detail, RF amplifier 16 is a bipolar transistor amplifier because of the low input impedance of DBM 41. A MOSFET is preferred for amplifier 48 since the AGC gate (84 in FIG. 2) has a high impedance and therefore does not require an emitter follower to drive it. Also the high input and output impedances of MOSFET 82 do not detune filters 80 and 88 with changes in AGC voltage. Still further, the AGC characteristic is delayed, i.e., only a small gain reduction of stage 48 takes place as RF signal strength initially increases so that stage 16 can first be gain controlled as signal strength increases.

Returning now to FIG. 1, also applied to mixer 50 is a 567 MHz signal from fixed frequency local oscillator 52. The output signal of mixer 50 is applied to filter 54, which can be of the SAW (surface acoustic wave) type. Filter 54 is tuned to the conventional 41–47 MHz television IF range, and thus it selects the difference frequency output signal from mixer 50. This signal is amplified and then detected in IF circuit 56 to provide a composite color signal and a 4.5 MHz intercarrier sound signal. Also provided by IF circuit 56 is an AGC signal having a range of 12 volts (maximum gain) to zero volts (minimum gain). Circuit 56 can be a type TA7607 integrated circuit manufactured by Toshiba Corporation.

The AGC voltage from circuit 56 is applied to series resistor 58 which prevents surges of the AGC voltage due, e.g., to an arc-over in the kinescope (not shown). Shunt capacitor 60, in conjunction with resistor 58 and the source resistance (e.g., 39,000 ohms) of the AGC voltage source in circuit 56, forms a low pass filter having a time constant selected so that the AGC circuit is stable and does not respond to short term perterbations of the received RF signal such as airplane flutter. The voltage across capacitor 60 is applied to a voltage divider comprising resistors 62 and 64. The junction of resistors 62 and 64 provides an AGC voltage to the high impedance gate 84 of MOSFET amplifier 48. The 8 volt maximum at the junction of resistors 62 and 64 is suitable for the biasing of MOSFET amplifier 48. The low input impedance bipolar control transistor 30 requires an emitter follower circuit comprising diode 66, transistor 68, and resistor 70 to increase the available current to drive transistor 30. Diode 66 prevents the base-emitter junction of transistor 68 from clamping the AGC voltage as explained later. The collector supply voltage, e.g., 18 volts, for transistor 68 is received at terminal 72. The AGC voltage at the emitter of transistor 68 is applied to diode 34 of amplifier 16 and to the equivalent diode (not shown) in amplifier 16a.

As explained in detail above, amplifiers 16 and 16a have bipolar transistors due to the low input impedance and current drive requirements of DBM 41 and therefore LPF 39, HPF 38 and LPF 38a. The low input impedance of DBM 41 is a result of the use of a diode bridge and its load impedance, which is made low to minimize spurious signal generation. The common emitter configuration is used to achieve a sufficiently high gain when negative feedback is used to achieve the low output impedance of stages 16 and 16a.

To explain the operation of the circuit, assume that a weak UHF RF signal is being received, and therefore the AGC voltage from circuit 56 is 12 volts. This voltage is lowered by the voltage drop through diode 66 and the base-emitter junction of transistor 68 and then raised by the voltage rise through diode 34 and the base-emitter junction of transistor 30. Thus, the voltage at the junction of resistors 24 and 26 is 12 volts. The value of resistors 24 and 26 are selected so that with this voltage at their junction, transistor 30 is providing current to the base of transistor 20 so that amplifier 16 is at the maximum of the gain versus emitter current of transistor 20 characteristic curve. Also, at this point, amplifier 48 is providing maximum gain since it is receiving 8 volts of AGC voltage.

As the received RF signal strength increases, the AGC voltage, and hence the voltage at the base of transistor 30, goes lower. This causes transistor 30 to draw more current through resistor 24 and supply the increased current to the base of transistor 20. Thus, more emitter and collector current is drawn by transistor 20 and hence the gain of amplifier 16 is decreased. The reduction of gain of amplifier 16 with increased signal strength protects amplifier 16 and DBM 41 from overloading and generating spurious signals. Because of the plateau region of the gain versus second gate voltage, the gain of amplifier 48 is initially only slightly decreased from its maximum at this point, thereby ensuring maximum signal to noise performance of amplifier 48.

The increased collector current of transistor 20 causes a drop in the collector voltage thereof and also a drop in the voltage at the junction of resistors 24 and 26. As the received RF signal strength increases still further, causing the AGC voltage to decrease still further, transistor 20 becomes saturated and its gain drops below unity, i.e., it provides attenuation. When transistor 20 is saturated, the voltage at the junction of resistors 24 and 26 will be at some value, e.g., 9 volts. As the RF signal strength still further increases, the AGC voltage drops still further, but the voltage at the junction of resistors 24 and 26 cannot go any lower, since transistor 20 is already saturated. Thus, the base-emitter junction of transistor 68 and diode 66 become reversed biased. Diode 66 has a large reverse breakdown voltage, e.g., 50 volts. This prevents any Zener effect in the base-emitter junction of transistor 68, which would clamp the AGC voltage from going below a certain amount. As the AGC voltage goes still lower, a gain reduction takes place in amplifier 48, thus continuing the AGC action that can no longer be performed by RF stage 16, since transistor 20 is already saturated. Near zero AGC volts, the largest reduction in gain of amplifier 48 takes place.

A feature of the invention will be appreciated by considering what happens if the base leakage current of transistor 20 increases, e.g., due to a temperature increase. Then the collector current increases, thereby lowering the voltage at the junction of resistors 24 and 26. This causes transistor 30 to provide less base current to transistor 20. If the leakage current decreases, the opposite effect takes place. Thus, transistor 30 provides negative DC feedback for transistor 20 to stabilize its bias point and gain which is determined by the AGC voltage at the base of transistor 30 and is relatively stable with changes in temperature. Similarly, if the bias current changes with changes in the base-emitter contact potential, the change will be compensated for by the negative feedback.

It will be appreciated that many modifications to the preferred embodiment are possible that are within the spirit and scope of the invention. For example, the emitter of transistor 20 need not be directly connected to ground, but can be grounded through a low value, e.g., 3 ohms, resistor. This resistor introduces some additional negative feedback that makes the gain of stage 16 even more uniform with frequency. Also, the use of a common operational amplifier instead of transistor 30 can be used to provide the AGC voltage for both VHF and UHF stages, as shown in concurrently filed application in the name of M. W. Muterspaugh, entitled "Bias and AGC Control of Two RF Amplfiers With A Single Operational Amplifier", (RCA 79,272) and under common assignment herewith.

The following table provides typical values for some elements:

| Element | Value |
| --- | --- |
| resistors 24 and 26 | 300 ohms |
| resistor 32 | 1.8 K ohms |
| resistor 62 | 1 Meg ohms |
| resistor 64 | 2 Meg ohms |
| resistor 58 | 1 K ohms |
| capacitor 60 | 4.7 μf |
| resistor 70 | 50 K ohms |
| capacitors 18, 29, 36, 23 | 1000 pf |
| resistor 19 | 470 ohms |
| coil 21 | 10 nH |

What is claimed is:
1. A double conversion television tuner comprising:
an input for RF signals;
a point of reference potential;
a first amplifier including a first bipolar transistor arranged as a common emitter amplifier with a base coupled to said RF input, an emitter coupled to said point of reference potential, and a collector;
a variable frequency local oscillator having an output;
a doubly balanced mixer, including first and second baluns having respective unbalanced inputs coupled to respective ones of said collector of said first amplifier and said output of said variable local oscillator, respective balanced outputs, a mixing element coupled to said balanced outputs, an an output;

a second amplifier having an input coupled to said output of said doubly balanced mixer, and an output;

a fixed frequency local oscillator having an output;

a second mixer having a first input coupled to said output of said second amplifier, a second input coupled to said output of said fixed local oscillator, and an output;

AGC means, coupled to said output of said second mixer, for providing an automatic gain control voltage; and varying means DC coupled between the base and collector electrodes of said transistor for providing feedback therebetween and receiving said automatic gain control voltage for varying the base bias current in accordance with said automatic gain control voltage and thereby varying the gain of said amplifier, wherein said varying means includes a second bipolar transistor of opposite conductivity type with respect to said first bipolar transistor having an emitter DC coupled to the collector of said first bipolar transistor, a collector DC coupled to the base of said first bipolar transistor and a base coupled to said AGC means to receive said AGC voltage.

2. Apparatus as claimed in claim 1, further comprising means, coupled to said first amplifier, for providing negative RF feedback thereto.

3. A tuner as claimed in claim 1, wherein said AGC means is also coupled to said second amplifier for controlling the gain thereof.

4. A tuner as claimed in claim 3, wherein with increasing signal strength said varying means substantially fully reduces the gain of said first amplifier before the gain of said second amplifier is substantially reduced.

5. A tuner as claimed in claim 1 wherein said second amplifier includes a field effect transistor; and coupling means for coupling said automatic gain control voltage to said field effect transistor.

6. A tuner as claimed in claim 1, further comprising a filter arrangement coupled between said collector of said first amplifier and said unbalanced input of said one of said baluns.

7. A tuner as claimed in claim 1, further comprising a low pass filter and an emitter follower coupled in cascade between said AGC means and said varying means for supplying said automatic gain control voltage to said varying means.

8. Apparatus comprising:
a bipolar common emitter configured transistor RF amplifier;

a source of an automatic gain control voltage; and varying means DC coupled between the base and collector electrodes of said transistor for providing feedback therebetween and receiving said automatic gain control voltage for varying the base bias current of said transistor in accordance with said automatic gain control voltage and thereby varying the gain of said amplifier, wherein said varying means comprises a second bipolar transistor having an emitter DC coupled to the collector of said common emitter configured transistor, a collector DC coupled to the base of said common emitter transistor, and a base coupled to receive said automatic gain control voltage.

9. Apparatus as claimed in claim 8, further comprising an RF choke coupled to the collector of said common emitter transistor, a first resistor coupled in series with said choke, a bypass capacitor coupled between the junction of said choke and said first resistor and ground, a second resistor coupled between said first resistor and a supply voltage source, the emitter of said second transistor being coupled to the junction of said first and second resistors, and a current limiting third resistor DC coupled between the collector of said control transistor and the base of said common emitter transistor.

10. Apparatus as claimed in claim 8, wherein the emitter of said common emitter configured transistor is directly coupled to a point of RF ground without any intervening elements.

11. Apparatus as claimed in claim 8, further comprising means, coupled to said transistor, for providing negative RF feedback thereto.

* * * * *